Sept. 30, 1969 L. P. MARKS 3,470,420

PRINTED CIRCUIT BOARD RACK

Filed June 1, 1967

Inventor
Lawrence P. Marks
By: Andrus & Starke
Attorneys

United States Patent Office 3,470,420
Patented Sept. 30, 1969

3,470,420
PRINTED CIRCUIT BOARD RACK
Lawrence P. Marks, Brown Deer, Wis., assignor to A. O. Smith Corporation, Milwaukee, Wis., a corporation of New York
Filed June 1, 1967, Ser. No. 642,788
Int. Cl. H02b *1/04, 9/00*
U.S. Cl. 317—101 5 Claims

ABSTRACT OF THE DISCLOSURE

A rack for a plurality of printed circuit boards is formed as a rectangular box-like structure which is open at the front and back. The box-like structure is formed with stamped metal walls including end walls including means having front mounting flanges for mounting of the rack into a suitable cabinet or other support. The top and bottom walls are similarly formed as planar members with end flanges riveted to the end walls. Back wall flanges on the top and bottom walls project toward each other and include similar laterally equally spaced openings.

This invention relates to a printed circuit board rack and particularly to a rack for housing a plurality of printed circuit boards in a reliable and inexpensive manner.

The development of compact and complex electronic circuits has resulted in the dividing of the circuit into subassemblies and building modules for facilitating manufacture, assembly and subsequent maintenance and repair. The printed circuit board or card which has been developed results in a relatively inexpensive method of mounting and interconnecting of electronic components as subassemblies or modules for subsequent insertion into a total unit. In order to facilitate the construction, reduce the manufacturing costs and the like, such circuit cards or boards are frequently formed with common modular dimensions such that each has a selected width and length and is provided with a plurality of similarly distributed terminals along one edge. The interconnection to the desired components is provided by selected interconnections to the printed circuitry on the surface or within the board. The boards are connected into circuit with each other and other components by plugging the boards into an appropriately wired terminal receptacle or the like.

The present invention is particularly directed to an enclosure, support or rack for a substantial plurality of such printed boards in alternately spaced relationship with a suitable plug-in type connector for providing interconnection to each other and into the total circuitry.

Circuit racks or supports have been suggested. Generally, the racks heretofore suggested have been found to be relatively costly particularly as to initial manufacture and assembly. This restricts the use to applications which require a relatively small number of racks. Where a very substantial number of racks is incorporated into a given control or circuit, the problem of cost and assembly of the rack into a total support becomes very significant.

The present invention is particularly directed to a rack which employs a minimum number of parts all of which may be readily mass produced and which require a minimum amount of assembly, expense and labor. Generally, in accordance with the present invention, a rack for a plurality of printed circuit boards is formed as a box-like structure open to the front and back. The box-like structure is formed with end walls including means such as front flanges for mounting of the rack into a suitable cabinet or other support. The top and bottom walls are similarly formed as planar members having back wall flanges which project toward each other. The walls are apertured or otherwise constructed to receive the opposite end of a connector which preferably is of a plug-in type. The connectors are secured to the back wall flanges at the opposite ends with a receptacle portion facing the front of the rack. Between each of the planes of the connectors, the top and bottom walls are provided with raised or embossed portions projecting inwardly toward each other a small degree. Each of the embossed areas or portions in accordance with a particularly novel concept and feature of this invention are formed as a pair of spaced extruded round holes, the sides of which taper inwardly to define a conical inward projection. The adjacent embossed portions are spaced from each other to define guides in alignment with the contact strips. This provides a convenient and inexpensive means for locating the contact boards while inserting them into the rack and maintaining them in laterally spaced relation. The side walls are provided with suitable openings to permit stacking of the racks with suitable link connectors interconnected to the end walls for construction of a multiple rack assembly.

The rack of the present invention is an exceptionally low cost unit requiring practically no assembly labor and expense.

The drawing furnished herewith illustrates a preferred construction of the present invention in which the above advantages and features are clearly disclosed as well as others which will be clear from the following description.

Figures 1, 2:
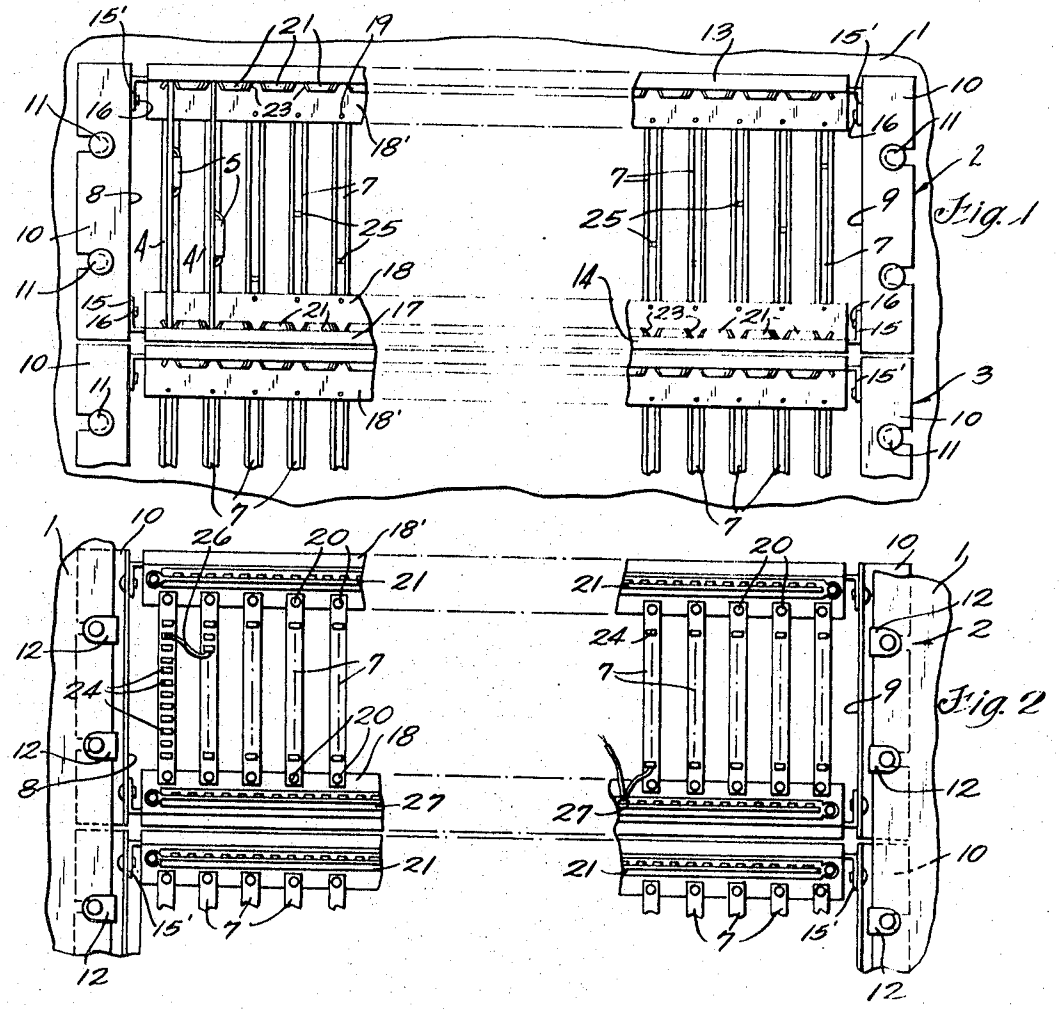
FIG. 1 is a front elevational fragmentary view of a cabinet with racks constructed in accordance with the present invention mounted therein.
FIG. 2 is a rear elevational view of the rack structure shown in FIG. 1.

Referring to the drawings and particularly to FIG. 1, the present invention is shown including a control cabinet 1 within which a pair of printed circuit board racks 2 and 3 is mounted in vertically stacked relationship. The racks 2 and 3 open outwardly toward the front of the cabinet 1 and support a plurality of printed circuit cards or boards 4 which are releasably held within the several racks 2 and 3. The printed circuit boards 4 are all generally similarly constructed of a basic board support in a known construction with a plurality of circuit components 5 interconnected through printed conductors suitably formed on or in the board unit and terminated in printed circuit terminals 6 extending in laterally spaced relation along the back edge of the board. When the board is inserted into a rack 2 or 3, it is plugged into a plug-in type receptacle connector 7 secured to and forming a part of the back wall of the corresponding rack, as hereinafter described.

Figures 3, 4:
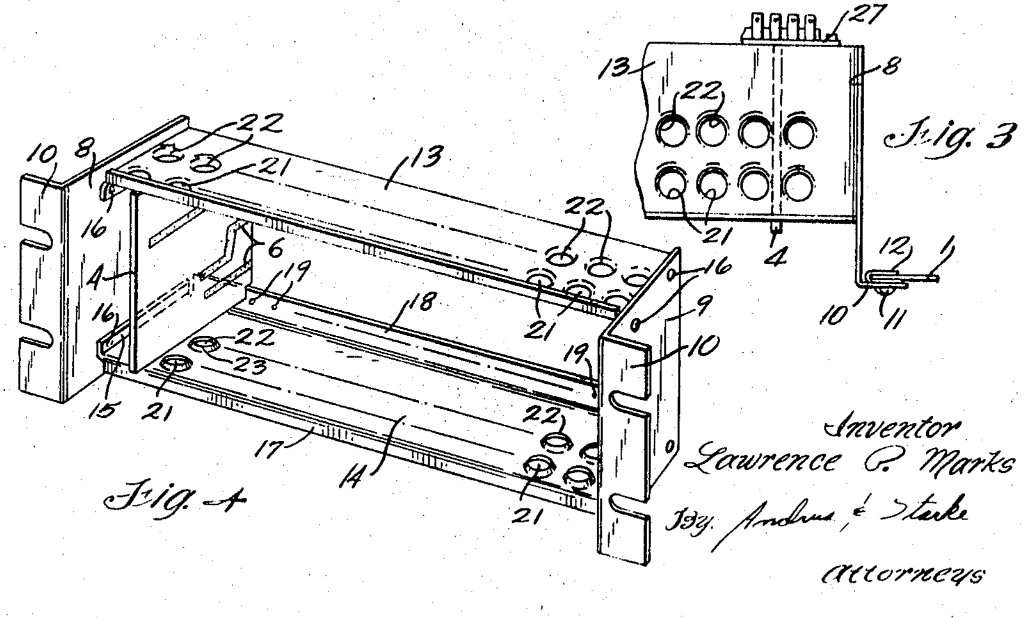
FIG. 3 is a top fragmentary view of the rack showing details of construction.
FIG. 4 is a fragmentary pictorial view of a rack unit shown in FIGS. 1–3.

The racks 2 and 3 which particularly form the subject matter of the present invention are identically formed and the rack 3 will be presently described more particularly with respect to FIGS. 2–4 to clearly illustrate a preferred embodiment of the present invention.

The rack 3 includes a pair of similar end walls 8 and 9, each of which is a rectangular plate-like member having a laterally extended mounting flange 10 on the forward edge. The mounting flange 10 abuts the panel face of the cabinet 1 or the like and is suitably releasably secured thereto. In the illustrated embodiment, a pair of machine screws 11 pass through a pair of suitable spaced slots in the edges of the flange 10 and thread into speed nuts 12 secured over the edge of the cabinet opening.

The end walls 8 and 9 are interconnected by a top wall 13 and a bottom wall 14, each of which are similarly formed but being mounted with the side portions in opposed relationship as presently described.

The several walls 8, 19, 13 and 14 are formed of a suitable rigid and self-supporting material such as metal, plastic or the like. In a preferred construction the walls are formed of a stamped metal.

Referring particularly to the bottom wall 14, the opposite ends of the wall are formed with upstanding end flanges 15 abutting the inner faces of the end walls 8 and 9 and fixed thereto by a pair of rivets 16 to rigidly interconnect the wall. The top wall 13 is similarly interconnected to the end walls 8 and 9 by a depending end flange 15' to form a rigid rack structure.

A depending front flange 17 is integrally formed along the front edge of the bottom wall 14 and is set in from the mounting flanges 10 by a predetermined amount. As hereinafter described, the identification for the function of the respective aligned boards 4 may be applied to the front mounting flange.

An upstanding back flange 18 is integrally connected along the back edge of the bottom wall 14 generally in the plane of the back edge of the end walls 8 and 9. The back flange 18 is provided with a plurality of equally spaced holes or openings 19 extending along the outer edge. The plug-in connectors 7 are narrow rectangular strip-like members and each spans the distance between the upstanding back flange 18 of the bottom wall 14 and a corresponding depending back flange 18' of the top wall 13. The connectors are interconnected to the top and bottom walls by small attachment screws 20 which pass through the opposite apertured ends of the connector 7 and thread into the spaced openings 19.

In accordance with the illustrated embodiment of the present invention, the top and bottom walls 13 and 14 are similarly provided with correspondingly located pairs of openings 21 and 22 between each of the immediately adjacent holes 19 or connector strips 7. The openings 21 and 22 in the top wall 13 are aligned with corresponding openings in bottom wall 14. Each opening 21 and 22 is similarly constructed with an inwardly projecting wall 23 which projects inwardly at an angle from the base of the wall to form a generally cone-shaped wall unit projecting into the rack. The spacing in the walls between the walls 23 of adjacent pairs of openings essentially corresponds to the width or thickness of a circuit board 4.

Particularly satisfactory racks have been formed of stamped metal members. The openings 21 and 22 with the conical wall 23 were formed as extruded round holes in the metal members as a mass production type operation. Such formation has been found to provide the desired advantageous tapered wall construction while maintaining adequate cooling of the circuit boards. This structure provides a very convenient guide for aligning of the circuit board 4 with the connector 7 and further maintains the spacing between the boards 4 when the rack is filled.

The connectors 7 may be any conventional or suitable plug-in type receptacle formed of a suitable base material with a plurality of contact pins 24 projecting from the back face thereof and longitudinally spaced within the body generally in accordance with the spacing of the board terminals 6 on the printed circuit boards 4. The front face of the connector 7 is recessed to define a socket connection for receiving the rear or inner terminal edge of the circuit board in accordance with well known constructions A forwardly projecting locating key 25 may be provided to the front of each connector 7 to restrict the insertion of circuit boards to any given receptacle in accordance with a predetermined design. The connectors 7 have the several pins 24 interconnected in a predetermined manner through connecting leads or wiring 26 in accordance with the usual construction.

Suitable terminal strips 27 are secured to the back face of the back flanges 18 and 18' immediately above and below the ends of the connectors 7 for making certain interconnections. Connecting leads, not shown, between boards 4 in adjacent racks may also be provided and preferably held together by suitable wire ties, not shown, secured to the back flanges of the respective racks. When the boards 4 are properly inserted or mounted in the rack, they are automatically and directly connected into a proper circuit.

The distance between the metal walls 23 of the openings and the boards may be less than the voltage breakover potential and the printed conductors should therefore be spaced sufficiently from the edge or coated with a suitable insulation to prevent possible shorting.

The rack of the present invention provides a very basic rack structure which can be mass produced economically. The rack can therefore be commercially applied to circuit systems employing an extremely great number of circuit boards without unduly increasing the cost of the unit.

Various modes of carrying out the invention are contemplated as being within the scope of the following claims particularly pointing out and distinctly claiming the subject matter which is regarded as the invention.

I claim:

1. A printed circuit board rack for supporting a plurality of similar boards in connection to connector strips, comprising a rectangular wall structure including spaced end walls connected to a top wall and a bottom wall, said top and bottom walls being generally flat plate-like members with oppositely extending back wall flanges, securement means for securing circuit board connectors to said flanges for receiving an aligned circuit board, integral raised embossments in said bottom wall between parallel planes through the several connector securement means, and similar integral raised embossments in the top wall in alignment with corresponding embossments in the bottom wall and adjacent embossments in each of said walls being spaced generally in accordance with insertion guide means and spacing means for the circuit boards.

2. The printed circuit board rack of claim 1 wherein said spaced end walls are similar flat plate-like members having rack mounting means, said top wall and bottom wall being similar members secured to the end walls in spaced relation to each other by a distance no greater than the depth of a circuit board, and said integral raised embossments in said top and bottom wall including a pair of raised circular embossments between each of said planes.

3. The printed circuit board rack of claim 1 wherein said top and bottom walls are identical and have inwardly extending end flanges secured to said end walls and having the front edge spaced inwardly of said mounting flanges, and said integral embossments in the respective top and bottom walls consisting of extruded openings with the walls of the opening tapering inwardly from the plane of the wall.

4. The printed circuit board of claim 1 wherein the embossments between the adjacent planes through the connector means each includes a pair of extruded openings being formed between each of the circuit board locations and being spaced from the adjacent pair of extruded openings generally in accordance with the thickness of a circuit board.

5. The printed circuit board rack of claim 1 wherein said walls are formed of stamped metal and said end walls are imperforate walls having outwardly projected perforated mounting flanges, said top and bottom walls being identical and having inwardly extending end flanges secured to said end walls and having the front edge spaced inwardly of said mounting flanges, said integral embossments in the respective top and bottom walls consisting of extruded openings with the walls of the opening tapering inwardly from the plane of the wall, a pair of extruded openings being formed between each of the circuit board locations and being spaced from the adjacent pair of extruded openings generally in accordance with the thickness of a circuit board, and said back wall flanges having equally and correspondingly spaced openings in the outer portions for bolt-type connection of the connector strips to said top and bottom wall flanges in a normal plane.

References Cited

UNITED STATES PATENTS

| | | |
|---|---|---|
| 2,945,989 | 7/1960 | Vogel. |
| 3,258,650 | 6/1966 | Fiege. |
| 3,271,626 | 8/1966 | Howrilka. |

E. A. GOLDBERG, Primary Examiner

U.S. Cl. X.R.

211—41